US010685727B2

(12) United States Patent
Lai

(10) Patent No.: US 10,685,727 B2
(45) Date of Patent: Jun. 16, 2020

(54) LEVEL SHIFTER

(71) Applicant: eMemory Technology Inc., Hsin-Chu (TW)

(72) Inventor: Tzu-Neng Lai, Hsinchu County (TW)

(73) Assignee: EMEMORY TECHNOLOGY INC., Hsin-Chu (TW)

(*) Notice: Subject to any disclaimer, the term of this patent is extended or adjusted under 35 U.S.C. 154(b) by 0 days.

(21) Appl. No.: 16/423,511

(22) Filed: May 28, 2019

(65) Prior Publication Data

US 2020/0052703 A1 Feb. 13, 2020

Related U.S. Application Data

(60) Provisional application No. 62/716,998, filed on Aug. 10, 2018.

(51) Int. Cl.

| | | |
|---|---|---|
| *G11C 17/16* | (2006.01) | |
| *H01L 27/112* | (2006.01) | |
| *G11C 17/18* | (2006.01) | |
| *H01L 23/525* | (2006.01) | |
| *H03K 3/356* | (2006.01) | |
| *H03K 17/284* | (2006.01) | |
| *H03K 19/00* | (2006.01) | |
| *H03K 19/0948* | (2006.01) | |

(52) U.S. Cl.
CPC .......... *G11C 17/16* (2013.01); *G11C 17/18* (2013.01); *H01L 23/5252* (2013.01); *H01L 27/11206* (2013.01); *H03K 3/356017* (2013.01); *H03K 17/284* (2013.01); *H03K 19/0016* (2013.01); *H03K 19/0948* (2013.01)

(58) Field of Classification Search
CPC .... H03K 17/00; H03K 17/102; H03K 17/284; H03K 19/00; H03K 19/0016; H03K 19/00315; H03K 19/018521; H03K 19/0948; H03K 3/00; H03K 3/012; H03K 3/356017; H03K 3/356113
USPC ........................................................ 327/333
See application file for complete search history.

(56) References Cited

U.S. PATENT DOCUMENTS

| 4,978,870 A | 12/1990 | Chen et al. |
| 2015/0303921 A1* | 10/2015 | Jung .............. H03K 19/018521 |
| | | 327/333 |

* cited by examiner

*Primary Examiner* — Lincoln D Donovan
*Assistant Examiner* — Dave Mattison
(74) *Attorney, Agent, or Firm* — WPAT, PC

(57) ABSTRACT

A level shifter includes a first output terminal and a second output terminal. After an output signal in a high level state is outputted from the first output terminal and an inverted output signal in a low level state is outputted from the second output terminal, a weak driving circuit is connected between the first output terminal and a power supply voltage, and a strong driving circuit is connected between the second output terminal and the power supply voltage. After the output signal in the low level state is outputted from the first output terminal and the inverted output signal in the high level state is outputted from the second output terminal, the strong driving circuit is connected between the first output terminal and the power supply voltage, and the weak driving circuit is connected between the second output terminal and the power supply voltage.

8 Claims, 7 Drawing Sheets

LEVEL SHIFTER

This application claims the benefit of U.S. provisional application Ser. No. 62/716,998, filed Aug. 10, 2018, the subject matter of which is incorporated herein by reference.

FIELD OF THE INVENTION

The present invention relates to a level shifter, and more particularly to a level shifter with asymmetrical driving paths.

BACKGROUND OF THE INVENTION

FIG. 1 is a schematic circuit diagram illustrating a conventional level shifter. By the level shifter 100, an input signal IN and an inverted input signal ZIN in the range between a voltage Vd and the voltage GND are changed to an output voltage OUT and an inverted output voltage ZOUT in the range between a voltage Vp and the voltage GND. The voltage Vd is a power supply voltage (e.g., 1.2V), the voltage Vp is another power supply voltage (e.g., 5V), and the voltage GND is a ground voltage (e.g., 0V). The input signal IN and the inverted input signal ZIN are complementary signals. The output voltage OUT and the inverted output voltage ZOUT are complementary signals.

As shown in FIG. 1, the level shifter 10 comprises a P-type transistor MP1, a P-type transistor MP2, an N-type transistor MN1, and an N-type transistor MN2. The source terminal of the P-type transistor MP1 receives the power supply voltage Vp. The drain terminal of the P-type transistor MP1 is connected with a node "a". The gate terminal of the P-type transistor MP1 is connected with a node "b". The source terminal of the P-type transistor MP2 receives the power supply voltage Vp. The drain terminal of the P-type transistor MP2 is connected with the node "b". The gate terminal of the P-type transistor MP2 is connected with the node "a".

The drain terminal of the N-type transistor MN1 is connected with the node "a". The source terminal of the N-type transistor MN1 is connected with the ground voltage GND. The gate terminal of the N-type transistor MN1 receives the input signal IN. The drain terminal of the N-type transistor MN2 is connected with the node "b". The source terminal of the N-type transistor MN2 is connected with the ground voltage GND. The gate terminal of the N-type transistor MN2 receives an inverted input signal ZIN. The node "b" is served as a first output terminal to output the output signal OUT. The node "a" is served as a second output terminal to output the inverted output signal ZOUT.

In case that the input signal IN is in a first high level state corresponding to the power supply voltage Vd (e.g., 1.2V) and the inverted input signal ZIN is in a low level state (e.g., 0V), the N-type transistor MN1 and the P-type transistor MP2 are turned on, and the N-type transistor MN2 and the P-type transistor MP1 are turned off. Consequently, the output signal OUT is in a second high level state corresponding to the power supply voltage Vp (e.g., 5V), and the inverted output signal ZOUT is in the low level state (e.g., 0V).

In case that the input signal IN is in the low level state (e.g., 0V) and the inverted input signal ZIN is in the first high level state corresponding to the power supply voltage Vd (e.g., 1.2V), the N-type transistor MN1 and the P-type transistor MP2 are turned off, and the N-type transistor MN2 and the P-type transistor MP1 are turned on. Consequently, the output signal OUT is in the low level state (e.g., 0V), and the inverted output signal ZOUT is in the second high level state corresponding to the power supply voltage Vp (e.g., 5V).

At the moment when the input signal IN is switched from the first high level state to the low level state (i.e., when the inverted input signal ZIN is switched from the low level state to the first high level state), the N-type transistor MN1 is turned off, the N-type transistor MN2 is turned on, and the P-type transistor MP1 is turned on. However, the P-type transistor MP2 is still turned on and not completely turned off. Under this circumstance, the level shifter 100 enters a short fighting period until the P-type transistor MP2 is completely turned off.

Similarly, at the moment when the input signal IN is switched from the low level state to the first high level state (i.e., when the inverted input signal ZIN is switched from the first high level state to the low level state), the P-type transistor MP1 is still turned on and not completely turned off. Under this circumstance, the level shifter 100 enters a short fighting period until the P-type transistor MP1 is completely turned off.

Generally, the driving strength of the P-type transistor is related to the channel length and the channel width of the P-type transistor. In case that the P-type transistor has a wider channel width and a shorter channel length, the P-type transistor has the higher driving strength. Whereas, in case that the P-type transistor has a narrower channel width and a longer channel length, the P-type transistor has the lower driving strength.

For shortening the fighting period of the level shifter 100, the power supply voltage Vp needs to be taken into consideration when the level shifter 100 is designed. Generally, in case that the magnitude of the power supply voltage Vp is lower (e.g., 1.5V), the driving strengths of the P-type transistor MP1 and the P-type transistor MP2 are designed to be as strong as possible. Whereas, in case that the magnitude of the power supply voltage Vp is higher (e.g., 5V), the driving strengths of the P-type transistor MP1 and the P-type transistor MP2 are designed to be as weak as possible.

However, it is difficult for the level shifter 100 to utilize the power supply voltage Vp in a wide range. For example, the level shifter 100 using the 1.5V power supply voltage Vp is not suitably operated at the 6V power supply voltage Vp.

SUMMARY OF THE INVENTION

In accordance with an aspect of the present invention, a level shifter is provided. The level shifter includes a first strong driving path, a first weak driving path, a second strong driving path, a second weak driving path, a selecting module, a first P-type transistor, a second P-type transistor, a first N-type transistor, a second N-type transistor and a timing controller. The selecting module includes a first selecting circuit and a second selecting circuit. The first strong driving path is connected between a power supply voltage and a first input terminal of the first selecting circuit. The first weak driving path is connected between the power supply voltage and a second input terminal of the first selecting circuit. The second strong driving path is connected between the power supply voltage and a first input terminal of the second selecting circuit. The second weak driving path is connected between the power supply voltage and a second input terminal of the second selecting circuit. A source terminal of the first P-type transistor is connected with an output terminal of the second selecting circuit. A drain terminal of the first P-type transistor is connected with a first node. A gate terminal of the first P-type transistor is connected with a second node. A source terminal of the second P-type transistor is connected with an output terminal of the first selecting circuit. A drain terminal of the second P-type transistor is connected with the second node. A gate terminal of the second P-type transistor is connected with the first node. The second node generates an output signal. The first node generates an inverted output signal. A drain terminal of the first N-type transistor is connected with the first node. A source terminal of the first N-type transistor is connected with a ground terminal. A gate terminal of the first N-type transistor receives an input signal. A drain terminal of the second N-type transistor is connected with the second node. A source terminal of the second N-type transistor is connected with the ground terminal. A gate terminal of the second N-type transistor receives an inverted input signal. When the input signal is in a first high level state, the output signal is in a second high level state. When the input signal is in a low level state, the output signal is in the low level state. The timing controller receives one of the output signal and the inverted output signal or receives both of the output signal and the inverted output signal. The timing controller issues a control signal group to the selecting module. The first selecting circuit and the second selecting circuit are controlled according to the control signal group.

After the output signal and the inverted output signal are respectively changed to the second high level state and the low level state for a time period, the first weak driving path is connected with the source terminal of the second P-type transistor by the first selecting circuit, and the second strong driving path is connected with the source terminal of the first P-type transistor by the second selecting circuit.

After the output signal and the inverted output signal are respectively changed to the low level state and the second high level state for the time period, the first strong driving path is connected with the source terminal of the second P-type transistor by the first selecting circuit, and the second weak driving path is connected with the source terminal of the first P-type transistor by the second selecting circuit.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

For allowing the level shifter to utilize the power supply voltage Vp in a wider range, the present invention provides a level shifter with asymmetrical driving paths.

Figure 1:
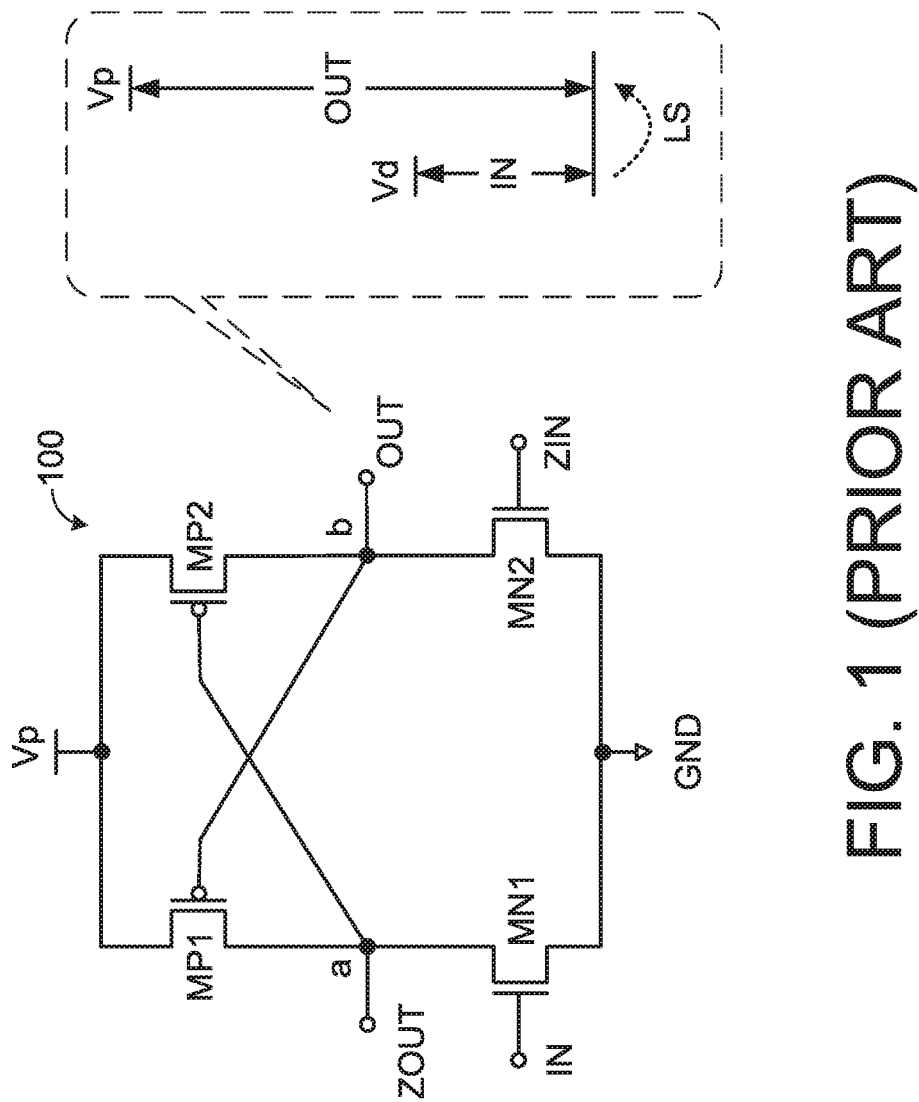
FIG. 1 (prior art) is a schematic circuit diagram illustrating a conventional level shifter.
Figure 2A:
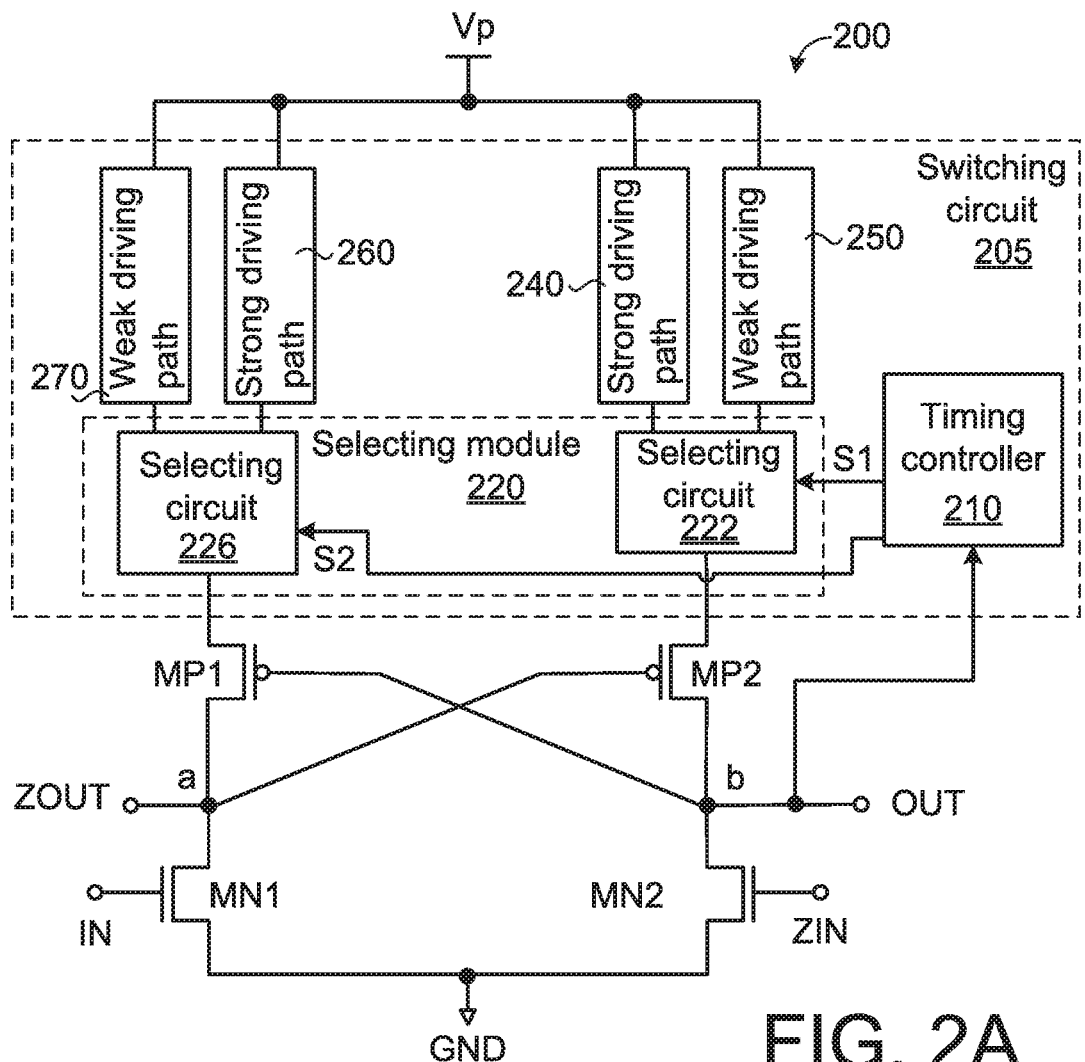
FIG. 2A is a schematic circuit diagram illustrating a level shifter according to a first embodiment of the present invention.
Figure 2B:
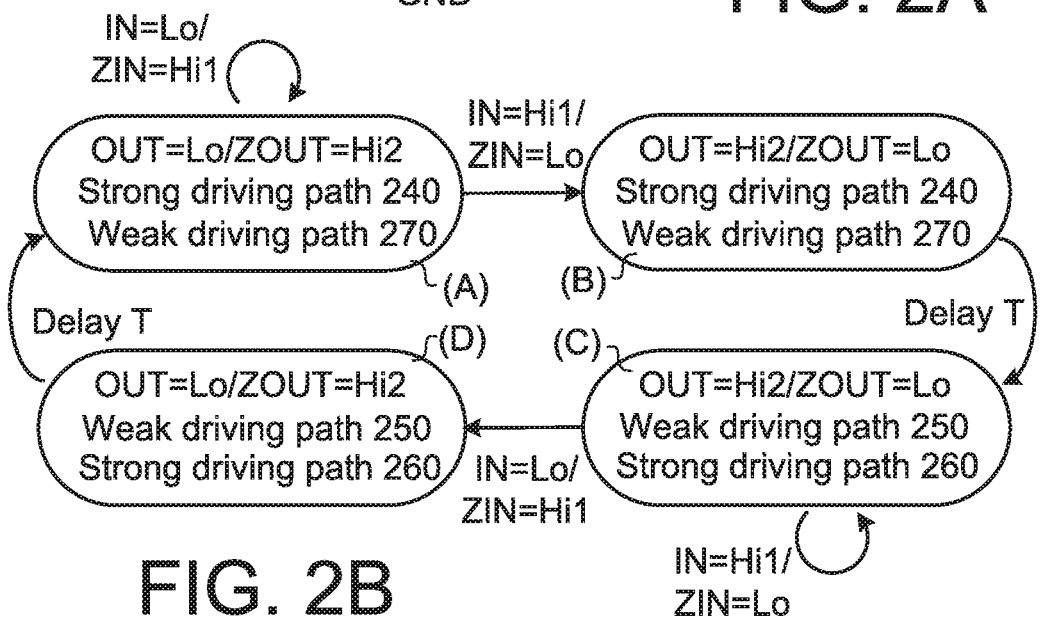
FIG. 2B is a schematic state diagram of the level shifter as shown in FIG. 2A.

Please refer to FIGS. 2A and 2B. FIG. 2A is a schematic circuit diagram illustrating a level shifter according to a first embodiment of the present invention. FIG. 2B is a schematic state diagram of the level shifter as shown in FIG. 2A.

As shown in FIG. 2A, the level shifter 200 comprises a switching circuit 205, a P-type transistor MP1, a P-type transistor MP2, an N-type transistor MN1, and an N-type transistor MN2. The switching circuit 205 comprises a timing controller 210, a selecting module 220, two strong driving paths 240, 260, and two weak driving paths 250, 270. The strong driving paths 240 and 260 have strong driving strengths. The weak driving paths 250 and 270 have weak driving strengths. Moreover, the selecting module 220 comprises two selecting circuits 222 and 226.

The source terminal of the P-type transistor MP1 is connected with the selecting circuit 226. The drain terminal of the P-type transistor MP1 is connected with a first node "a". The gate terminal of the P-type transistor MP1 is connected with a second node "b". The source terminal of the P-type transistor MP2 is connected with the selecting circuit 222. The drain terminal of the P-type transistor MP2 is connected with the second node "b". The gate terminal of the P-type transistor MP2 is connected with the first node "a".

The drain terminal of the N-type transistor MN1 is connected with the first node "a". The source terminal of the N-type transistor MN1 is connected with the ground voltage GND. The gate terminal of the N-type transistor MN1 receives the input signal IN. The drain terminal of the N-type transistor MN2 is connected with the second node "b". The source terminal of the N-type transistor MN2 is connected with the ground voltage GND. The gate terminal of the N-type transistor MN2 receives an inverted input signal ZIN. The second node "b" is served as a first output terminal to output the output signal OUT. The first node "a" is served as a second output terminal to output the inverted output signal ZOUT.

The timing controller 210 of the switching circuit 205 receives the output signal OUT and generates a control signal group. The control signal group comprises two selecting signals S1 and S2.

The strong driving path 240 and the weak driving path 250 are connected between a power supply voltage Vp and the selecting circuit 222 of the selecting module 220. Moreover, the selecting circuit 222 is connected with the source terminal of the P-type transistor MP2. The selecting circuit 222 is also connected with the timing controller 210. According to the selecting signal S1 of the control signal group, one of the strong driving path 240 and the weak driving path 250 is selected to be connected with the source terminal of the P-type transistor MP2 by the selecting circuit 222.

Similarly, the strong driving path 260 and the weak driving path 270 of the selecting module 220 are connected between the power supply voltage Vp and the selecting circuit 226 of the selecting module 220. Moreover, the selecting circuit 226 is connected with the source terminal of the P-type transistor MP1. The selecting circuit 226 is also connected with the timing controller 210. According to the selecting signal S2 of the control signal group, one of the strong driving path 260 and the weak driving path 270 is selected to be connected with the source terminal of the P-type transistor MP1 by the selecting circuit 226.

Please refer to FIG. 2B. When the level shifter 200 is in an operating state (A), the output signal OUT is in the low level state Lo, and the inverted output signal ZOUT is in a second high level state Hi2. Under this circumstance, the strong driving path 240 is connected with the source terminal of the P-type transistor MP2, and the weak driving path 270 is connected with the source terminal of the P-type transistor MP1. In case that the input signal IN is in maintained in the low level state Lo and the inverted input signal ZIN is in maintained in a first high level state Hi1, the level shifter 200 is maintained in the operating state (A).

When the input signal IN is switched to the first high level state Hi1 and the inverted input signal ZIN is switched to the low level state Lo, the operating state of the level shifter 200 is changed from the operating state (A) to an operating state (B).

In the operating state (A), the strong driving path 240 is connected with the source terminal of the P-type transistor MP2, and the weak driving path 270 is connected with the source terminal of the P-type transistor MP1. Consequently, when the input signal IN is switched to the first high level state Hi1, the N-type transistor MN1 is turned on. Since the source terminal of the P-type transistor MP1 is connected with the weak driving path 270, the inverted output signal ZOUT is pulled down to the low level state Lo quickly. Moreover, when the inverted input signal ZIN is switched to the low level state Lo, the N-type transistor MN2 is turned off. Since the P-type transistor MP2 is connected with the strong driving path 240, the output signal OUT is pulled up to the second high level state Hi2 quickly. Since the output signal OUT is in the second high level state Hi2 and the inverted output signal ZOUT is in the low level state Lo, the operating state of the level shifter 200 is changed to the operating state (B). Under this circumstance, the strong driving path 240 is connected with the source terminal of the P-type transistor MP2, and the weak driving path 270 is connected with the source terminal of the P-type transistor MP1.

Generally, the operating state (B) is a transient state. After the operating state of the level shifter 200 is changed to the operating state (B) for one time period T, the operating state of the level shifter 200 is changed to an operating state (C). Moreover, while the operating state of the level shifter 200 is changed from the operating state (B) to the operating state (C), the output signal OUT and the inverted output signal ZOUT are kept unchanged.

In this embodiment, after the output signal OUT is changed from the low level state Lo to the second high level state Hi2 for one time period T, the timing controller 210 changes the selecting signals S1 and S2 of the control signal group. Consequently, the weak driving path 250 is connected with the source terminal of the P-type transistor MP2 by the selecting circuit 222, and the strong driving path 260 is connected with the source terminal of the P-type transistor MP1 by the selecting circuit 226.

That is, when the operating state of the level shifter 200 is changed to the operating state (C), the output signal OUT is maintained in the second high level state Hi2 and the inverted output signal ZOUT is maintained in the low level state Lo. Moreover, the weak driving path 250 is connected with the source terminal of the P-type transistor MP2, and the strong driving path 260 is connected with the source terminal of the P-type transistor MP1. In case that the input signal IN is maintained in the first high level state Hi1 and the inverted input signal ZIN is maintained in the low level state Lo, the operating state of the level shifter 200 is maintained in the operating state (C).

When the input signal IN is switched to the low level state Lo and the inverted input signal ZIN is switched to the first high level state Hi1, the operating state of the level shifter 200 is changed from the operating state (C) to an operating state (D).

In the operating state (C), the weak driving path 250 is connected with the source terminal of the P-type transistor MP2, and the strong driving path 260 is connected with the source terminal of the P-type transistor MP1. Consequently, when the inverted input signal ZIN is switched to the first high level state Hi1 the N-type transistor MN2 is turned on. Since the source terminal of the P-type transistor MP2 is connected with the weak driving path 250, the output signal ZOU is pulled down to the low level state Lo quickly. Moreover, when the input signal IN is switched to the low level state Lo, the N-type transistor MN1 is turned off. Since the second P-type transistor MP1 is connected with the strong driving path 260, the inverted output signal ZOUT is pulled up to the second high level state Hi2 quickly. Since the output signal OUT is in the low level state Lo and the inverted output signal ZOUT is in the second high level state Hi2, the operating state of the level shifter 200 is changed to the operating state (D). Under this circumstance, the weak driving path 250 is connected with the source terminal of the P-type transistor MP2, and the strong driving path 260 is connected with the source terminal of the P-type transistor MP1.

Generally, the operating state (D) is a transient state. After the operating state of the level shifter 200 is changed to the operating state (D) for one time period T, the operating state of the level shifter 200 is changed to the operating state (A). Moreover, while the operating state of the level shifter 200 is changed from the operating state (D) to the operating state (A), the output signal OUT and the inverted output signal ZOUT are kept unchanged.

In this embodiment, after the output signal OUT is changed from the second high level state Hi2 to the low level state Lo for one time period T, the timing controller 210 changes the selecting signals S1 and S2 of the control signal group. Consequently, the strong driving path 240 is connected with the source terminal of the P-type transistor MP2 by the selecting circuit 222, and the weak driving path 270 is connected with the source terminal of the P-type transistor MP1 by the selecting circuit 226.

That is, when the operating state of the level shifter 200 is changed to the operating state (A), the output signal OUT is maintained in the low level state Lo and the inverted output signal ZOUT is maintained in the second high level state Hi2. Moreover, the strong driving path 240 is connected with the source terminal of the P-type transistor MP2, and the weak driving path 270 is connected with the source terminal of the P-type transistor MP1.

Similarly, in case that the input signal IN is maintained in the low level state Lo and the inverted input signal ZIN is maintained in the first high level state Hi1, the operating state of the level shifter 200 is maintained in the operating state (A). When the input signal IN is switched to the first high level state Hi1 and the inverted input signal ZIN is switched to the low level state Lo, the operating state of the level shifter 200 is changed from the operating state (A) to an operating state (B).

As mentioned above, the output signal OUT and the inverted output signal ZOUT are complementary signals. It is noted that the timing controller 210 of the switching circuit 205 may be modified. For example, in another embodiment, the timing controller 210 receives the inverted output signal ZOUT and generates the selecting signals S1 and S2 of the control signal group. In a further embodiment, the timing controller 210 receives the output signal OUT and the inverted output signal ZOUT and generates the selecting signals S1 and S2 of the control signal group.

Figure 3A:
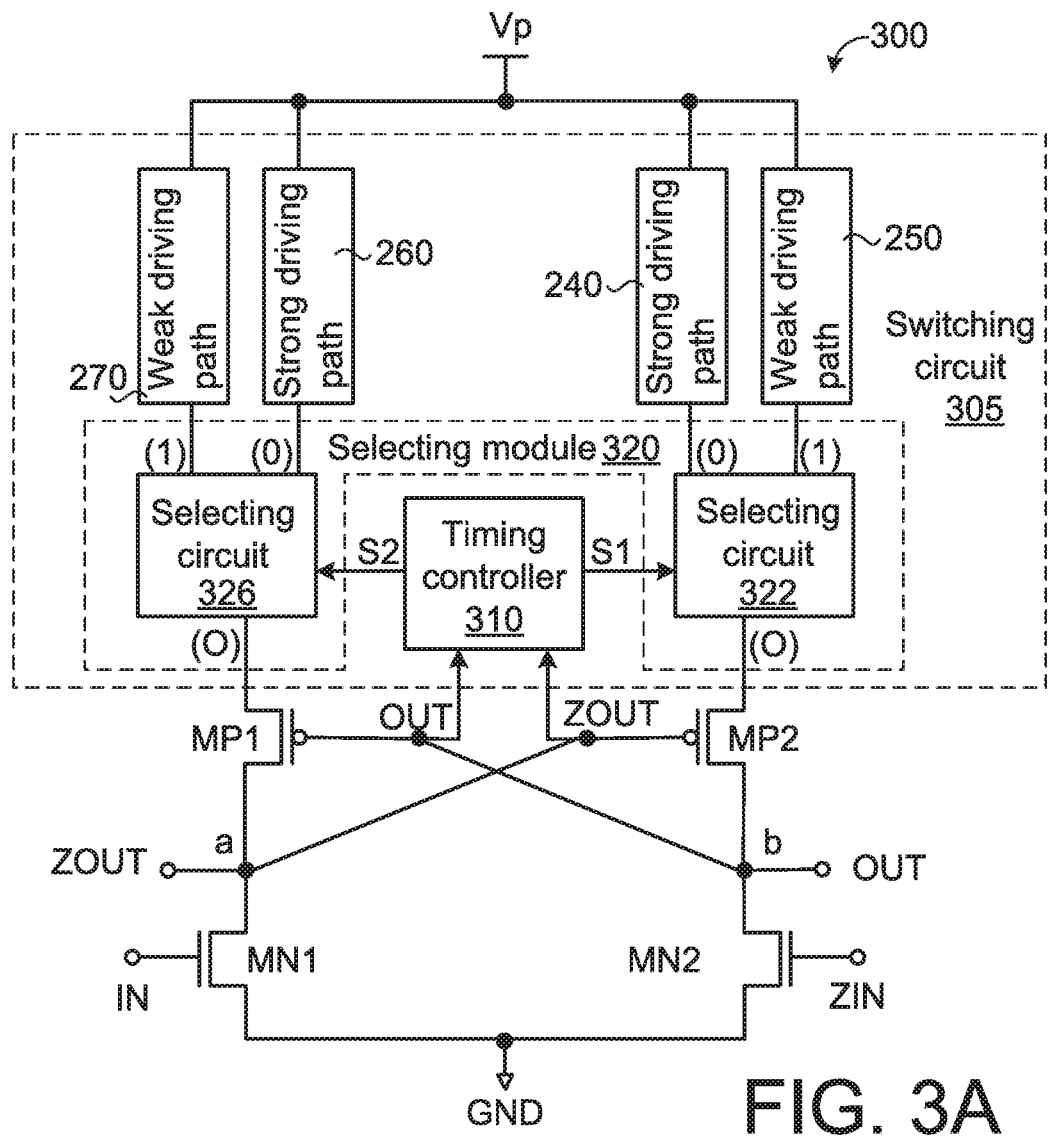
FIG. 3A is a schematic circuit diagram illustrating a level shifter according to a second embodiment of the present invention.
Figure 3B:
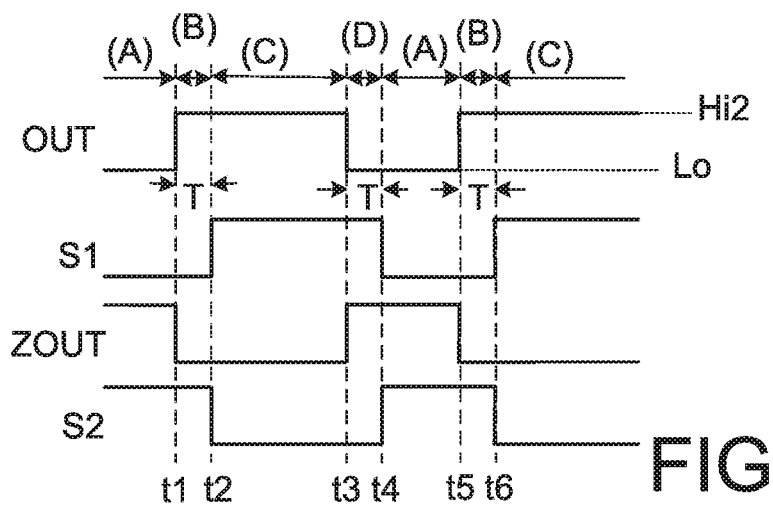
FIG. 3B is a schematic timing waveform diagram illustrating associated signals of the level shifter as shown in FIG. 3A.

Please refer to FIGS. 3A and 3B. FIG. 3A is a schematic circuit diagram illustrating a level shifter according to a second embodiment of the present invention. FIG. 3B is a schematic timing waveform diagram illustrating associated signals of the level shifter as shown in FIG. 3A.

As shown in FIG. 3A, the level shifter 300 comprises a switching circuit 305, a P-type transistor MP1, a P-type transistor MP2, an N-type transistor MN1, and an N-type transistor MN2. The connecting relationships between the P-type transistor MP1, the P-type transistor MP2, the N-type transistor MN1 and the N-type transistor MN2 are similar to those of the first embodiment, and are not redundantly described herein.

The switching circuit 305 comprises a timing controller 310, a selecting module 320, two strong driving paths 240, 260, and two weak driving paths 250, 270. Moreover, the selecting module 320 comprises two selecting circuits 322 and 326. The timing controller 310 of the switching circuit 305 receives the output signal OUT and the inverted output signal ZOUT and generates a control signal group. The control signal group comprises two selecting signals S1 and S2.

The strong driving path 240 is connected between the power supply voltage Vp and a first terminal (0) of the selecting circuit 322. The weak driving path 250 is connected between the power supply voltage Vp and a second terminal (1) of the selecting circuit 322. Moreover, an output terminal (O) of the selecting circuit 322 is connected with the source terminal of the P-type transistor MP2. When the selecting signal S1 is in a second high level state Hi2, the second terminal (1) of the selecting circuit 322 is connected with the output terminal (O) of the selecting circuit 322. Consequently, the weak driving paths 250 is connected with the source terminal of the P-type transistor MP2 by the selecting circuit 322. When the selecting signal S1 is in a low level state Lo, the first terminal (0) of the selecting circuit 322 is connected with the output terminal (O) of the selecting circuit 322. Consequently, the strong driving path 240 is connected with the source terminal of the P-type transistor MP2 by the selecting circuit 322.

The strong driving path 260 is connected between the power supply voltage Vp and a first terminal (0) of the selecting circuit 326. The weak driving paths 270 is connected between the power supply voltage Vp and a second terminal (1) of the selecting circuit 326. Moreover, an output terminal (O) of the selecting circuit 326 is connected with the source terminal of the P-type transistor MP1. When the selecting signal S2 is in the second high level state Hi2, the second terminal (1) of the selecting circuit 326 is connected with the output terminal (O) of the selecting circuit 326. Consequently, the weak driving path 270 is connected with the source terminal of the P-type transistor MP1. When the selecting signal S2 is in the low level state Lo, the first terminal (0) of the selecting circuit 326 is connected with the output terminal (O) of the selecting circuit 326. Consequently, the strong driving path 260 is connected with the source terminal of the P-type transistor MP1.

In this embodiment, the timing controller 310 is a delaying circuit. After the output signal OUT is delayed for one time period T by the timing controller 310, the selecting signal S1 is generated. In other words, the selecting signal S1 lags the output signal OUT by one time period T. After the inverted output signal ZOUT is delayed for one time period T by the timing controller 310, the selecting signal S2 is generated. In other words, the selecting signal S2 lags the inverted output signal ZOUT by one time period T. In an embodiment, the time period T is in the range between 5 ns and 15 ns.

Please refer to FIG. 3B. Before the time point t1, the level shifter 300 is in an operating state (A). Meanwhile, the output signal OUT is in the low level state Lo, and the inverted output signal ZOUT is in a second high level state Hi2. Since the selecting signal S1 is in the low level state Lo, the strong driving path 240 is connected with the source terminal of the P-type transistor MP2. Since the selecting signal S2 is in the second high level state Hi2, the weak driving path 270 is connected with the source terminal of the P-type transistor MP1.

At the time point t1, the output signal OUT is changed to the second high level state Hi2 and the inverted output signal ZOUT is changed to the low level state Lo. Consequently, the operating state of the level shifter 300 is changed from the operating state (A) to the operating state (B). Since the selecting signal S1 is in the low level state Lo, the strong driving path 240 is connected with the source terminal of the P-type transistor MP2. Since the selecting signal S2 is in the second high level state Hi2, the weak driving path 270 is connected with the source terminal of the P-type transistor MP1.

After the operating state of the level shifter 300 is changed to the operating state (B) for one time period T (i.e., at the time point t2), the selecting signal S1 is changed to the second high level state Hi2 and thus the weak driving path 250 is connected with the source terminal of the P-type transistor MP2. Moreover, since the selecting signal S2 is changed to the low level state Lo, the strong driving path 260 is connected with the source terminal of the P-type transistor MP1. Moreover, the output signal OUT is maintained in the second high level state Hi2, and the inverted output signal ZOUT is maintained in the low level state Lo. Consequently, the operating state of the level shifter 300 is changed from the operating state (B) to the operating state (C).

At the time point t3, the output signal OUT is changed to the low level state Lo, and the inverted output signal ZOUT is changed to the second high level state Hi2. Consequently, the operating state of the level shifter 300 is changed from the operating state (C) to the operating state (D). Since the selecting signal S1 is in the second high level state Hi2, the weak driving path 250 is connected with the source terminal of the P-type transistor MP2. Moreover, since the selecting signal S2 is in the low level state Lo, the strong driving path 260 is connected with the source terminal of the P-type transistor MP1.

After the operating state of the level shifter 300 is changed to the operating state (D) for one time period T (i.e., at the time point t4), the selecting signal S1 is changed to the low level state Lo and thus the strong driving path 240 is connected with the source terminal of the P-type transistor MP2. Moreover, since the selecting signal S2 is changed to the second high level state Hi2, the weak driving path 270 is connected with the source terminal of the P-type transistor MP1. Consequently, the operating state of the level shifter 300 is changed from the operating state (D) to the operating state (A).

At the time point t5, the operating state of the level shifter 300 is changed from the operating state (A) to the operating state (B). At the time point t6, the operating state of the level shifter 300 is changed from the operating state (B) to the operating state (C). The rest may be deduced by analogy.

As mentioned above, the output signal OUT and the inverted output signal ZOUT are complementary signals. It is noted that the timing controller 310 of the switching circuit 305 may be modified. For example, in another embodiment, the timing controller 310 receives the output signal OUT and generates the selecting signals S1 and S2 of the control signal group. In a further embodiment, the timing controller 310 receives the inverted output signal ZOUT and generates the selecting signals S1 and S2 of the control signal group.

Figures 4A, 4B:
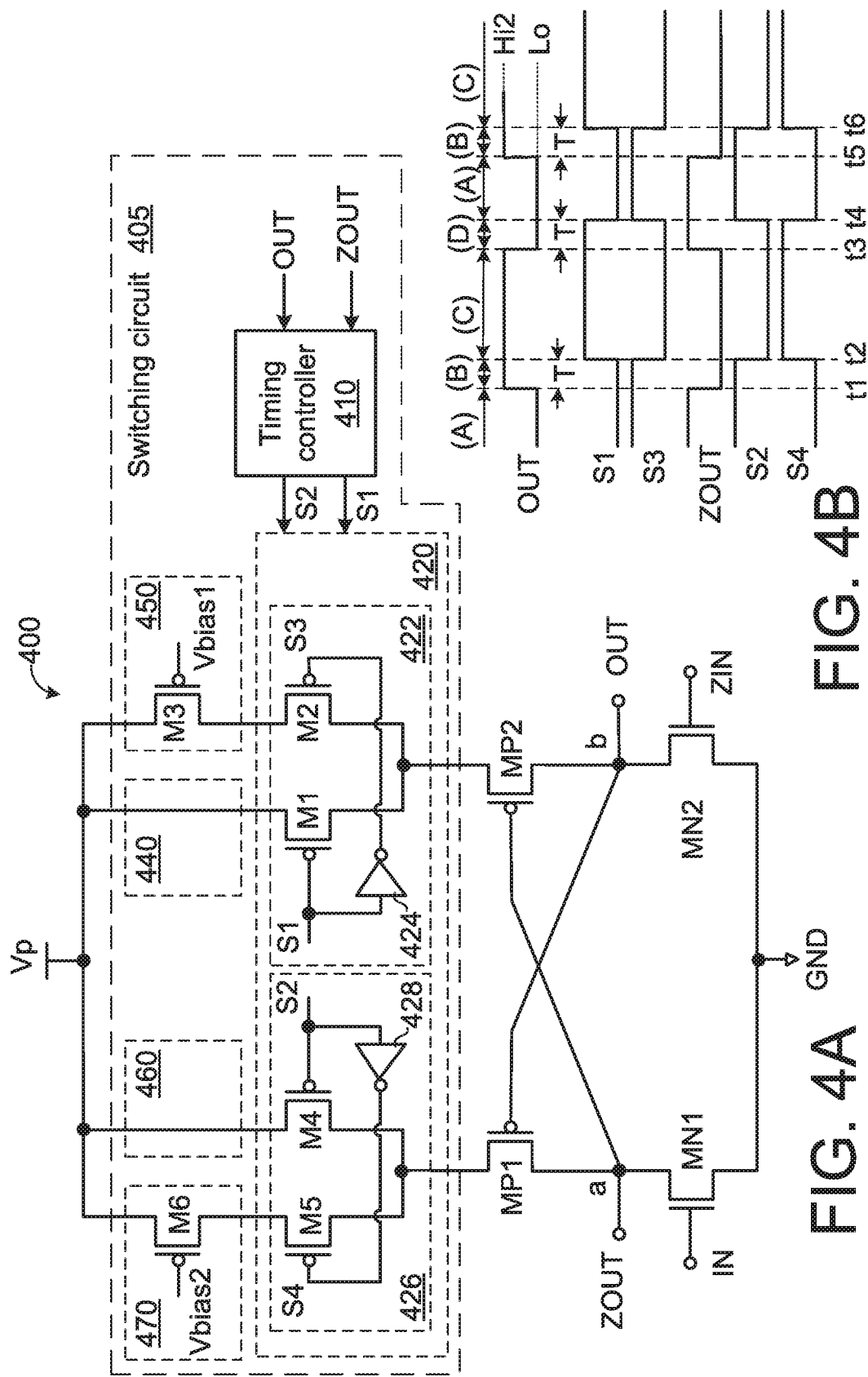
FIG. 4A is a schematic circuit diagram illustrating a level shifter according to a third embodiment of the present invention.
FIG. 4B is a schematic timing waveform diagram illustrating associated signals of the level shifter as shown in FIG. 4A.

Please refer to FIGS. 4A and 4B. FIG. 4A is a schematic circuit diagram illustrating a level shifter according to a third embodiment of the present invention. FIG. 4B is a schematic timing waveform diagram illustrating associated signals of the level shifter as shown in FIG. 4A.

As shown in FIG. 4A, the level shifter 400 comprises a switching circuit 405, a P-type transistor MP1, a P-type transistor MP2, an N-type transistor MN1, and an N-type transistor MN2. The connecting relationships between the P-type transistor MP1, the P-type transistor MP2, the N-type transistor MN1 and the N-type transistor MN2 are similar to those of the first embodiment, and are not redundantly described herein.

The switching circuit 405 comprises a timing controller 410, a selecting module 420, two strong driving paths 440, 460, and two weak driving paths 450, 470. Moreover, the selecting module 420 comprises two selecting circuits 422 and 426. The timing controller 410 of the switching circuit 405 receives the output signal OUT and the inverted output signal ZOUT and generates a control signal group. The control signal group comprises two selecting signals S1 and S2.

The selecting circuit 422 comprises two P-type transistors M1, M2 and an inverter 424. The inverter 424 receives a selecting signal S1 and generates a selecting signal S3. The source terminal of P-type transistors M1 is a first input terminal of the selecting circuit 422. The gate terminal of P-type transistors M1 receives the selecting signal S1. The drain terminal of P-type transistors M1 is an output terminal of the selecting circuit 422 and connected with the source terminal of the P-type transistor MP2. The source terminal of P-type transistors M2 is a second input terminal of the selecting circuit 422. The gate terminal of P-type transistors M2 receives the selecting signal S3. The drain terminal of P-type transistors M2 is connected with the drain terminal of P-type transistors M1.

The selecting circuit 426 comprises two P-type transistors M4, M5 and an inverter 428. The inverter 428 receives a selecting signal S2 and generates a selecting signal S4. The source terminal of P-type transistors M4 is a first input terminal of the selecting circuit 426. The gate terminal of P-type transistors M4 receives the selecting signal S2. The drain terminal of P-type transistors M4 is an output terminal of the selecting circuit 426 and connected with the source terminal of the second P-type transistor MP1. The source terminal of P-type transistors M5 is a second input terminal of the selecting circuit 426. The gate terminal of P-type transistors M5 receives the selecting signal S4. The drain terminal of P-type transistors M5 is connected with the drain terminal of P-type transistors M4.

In this embodiment, the strong driving path 440 is a conducting line, which is connected between the power supply voltage Vp and a first terminal of the selecting circuit 422. The weak driving path 450 comprises a P-type transistor M3. The gate terminal of the P-type transistor M3 receives a bias voltage Vbias1. The source terminal of the P-type transistor M3 receives the power supply voltage Vp. The drain terminal of the P-type transistor M3 is connected with a second terminal of the selecting circuit 422. In this embodiment, the strong driving path 460 is a conducting line, which is connected between the power supply voltage Vp and a first terminal of the selecting circuit 426. The weak driving path 470 comprises a P-type transistor M6. The gate terminal of the P-type transistor M6 receives a bias voltage Vbias2. The source terminal of the P-type transistor M6 receives the power supply voltage Vp. The drain terminal of the P-type transistor M6 is connected with a second terminal of the selecting circuit 426.

In accordance with the present invention, the P-type transistor M3 of the weak driving path 450 and the P-type transistor M6 of the weak driving path 470 have small channel aspect ratios. In an embodiment, the magnitudes of the bias voltages Vbias1 and Vbias2 are identical (e.g., equal to a ground voltage). Alternatively, the bias voltages Vbias1 and Vbias2 are different signals. For example, the input voltage IN is used as the bias voltage Vbias1, and the inverted input signal ZIN is used as the bias voltage Vbias2.

In this embodiment, the timing controller 410 is a delaying circuit. After the output signal OUT is delayed for one time period T by the timing controller 410, the selecting signal S1 is generated. In other words, the selecting signal S1 lags the output signal OUT by one time period T. After the inverted output signal ZOUT is delayed for one time period T by the timing controller 410, the selecting signal S2 is generated. In other words, the selecting signal S2 lags the inverted output signal ZOUT by one time period T. The selecting signal S1 and the selecting signal S4 are identical. The selecting signal S2 and the selecting signal S3 are identical. In an embodiment, the time period T is in the range between 5 ns and 15 ns.

Please refer to FIG. 4B. Before the time point t1, the level shifter 400 is in an operating state (A). Meanwhile, the output signal OUT is in the low level state Lo, and the inverted output signal ZOUT is in a second high level state Hi2. Since the selecting signal S1 is in the low level state Lo and the selecting signal S3 is in the second high level state Hi2, the P-type transistor M1 is turned on and the P-type transistor M2 is turned off. Meanwhile, the strong driving path 440 is connected with the source terminal of the P-type transistor MP2. Since the selecting signal S2 is in the second high level state Hi2 and the selecting signal S4 is in the low level state Lo, the P-type transistor M4 is turned off and the P-type transistor M5 is turned on. Meanwhile, the weak driving path 470 is connected with the source terminal of the P-type transistor MP1.

At the time point t1, the output signal OUT is changed to the second high level state Hi2 and the inverted output signal ZOUT is changed to the low level state Lo. Consequently, the operating state of the level shifter 400 is changed from the operating state (A) to the operating state (B). Since the selecting signal S1 is in the low level state Lo and the selecting signal S3 is in the second high level state Hi2, the P-type transistor M1 is turned on and the P-type transistor M2 is turned off. Meanwhile, the strong driving path 440 is connected with the source terminal of the P-type transistor MP2. Since the selecting signal S2 is in the second high level state Hi2 and the selecting signal S4 is in the low level state Lo, the P-type transistor M4 is turned off and the P-type transistor M5 is turned on. Meanwhile, the weak driving path 470 is connected with the source terminal of the P-type transistor MP1.

After the operating state of the level shifter 400 is changed to the operating state (B) for one time period T (i.e., at the time point t2), the selecting signal S1 is changed to the second high level state Hi2 and the selecting signal S3 is changed to the low level state Lo. The P-type transistor M1 is turned off, and the P-type transistor M2 is turned on. Meanwhile, the weak driving path 450 is connected with the source terminal of the P-type transistor MP2. Moreover, since the selecting signal S2 is changed to the low level state Lo and the selecting signal S4 is changed to the second high level state Hi2, the P-type transistor M4 is turned on and the P-type transistor M5 is turned off. Meanwhile, the strong driving path 460 is connected with the source terminal of the P-type transistor MP1. Moreover, the output signal OUT is maintained in the second high level state Hi2, and the inverted output signal ZOUT is maintained in the low level state Lo. Consequently, the operating state of the level shifter 400 is changed from the operating state (B) to the operating state (C).

At the time point t3, the output signal OUT is changed to the low level state Lo, and the inverted output signal ZOUT is changed to the second high level state Hi2. Consequently, the operating state of the level shifter 300 is changed from the operating state (C) to the operating state (D). Since the selecting signal S1 is in the second high level state Hi2 and the selecting signal S3 is in the low level state Lo, the P-type transistor M1 is turned off and the P-type transistor M2 is turned on. Meanwhile, the weak driving path 450 is connected with the source terminal of the P-type transistor MP2. Moreover, since the selecting signal S2 is in the low level state Lo and the selecting signal S4 is in the second high level state Hi2, the P-type transistor M4 is turned on and the P-type transistor M5 is turned off. Meanwhile, the strong driving path 460 is connected with the source terminal of the P-type transistor MP1.

After the operating state of the level shifter 400 is changed to the operating state (D) for one time period T (i.e., at the time point t4), the selecting signal S1 is changed to the low level state Lo and the selecting signal S4 is in the second high level state Hi2. The P-type transistor M1 is turned on, and the P-type transistor M2 is turned off. Meanwhile, the strong driving path 440 is connected with the source terminal of the P-type transistor MP2. Moreover, since the selecting signal S2 is changed to the second high level state Hi2 and the selecting signal S4 is in the low level state Lo, the P-type transistor M4 is turned off and the P-type transistor M5 is turned on. Meanwhile, the weak driving path 470 is connected with the source terminal of the P-type transistor MP1. Moreover, the output signal OUT is maintained in the low level state Lo, and the inverted output signal ZOUT is maintained in the second high level state Hi2. Consequently, the operating state of the level shifter 400 is changed from the operating state (D) to the operating state (A).

At the time point t5, the operating state of the level shifter 400 is changed from the operating state (A) to the operating state (B). At the time point t6, the operating state of the level shifter 400 is changed from the operating state (B) to the operating state (C). The rest may be deduced by analogy.

As mentioned above, the output signal OUT and the inverted output signal ZOUT are complementary signals. It is noted that the timing controller 410 of the switching circuit 405 may be modified. For example, in another embodiment, the timing controller 410 receives the output signal OUT and generates the selecting signals S1 and S2 of the control signal group. In a further embodiment, the timing controller 410 receives the inverted output signal ZOUT and generates the selecting signals S1 and S2 of the control signal group.

Figure 5:
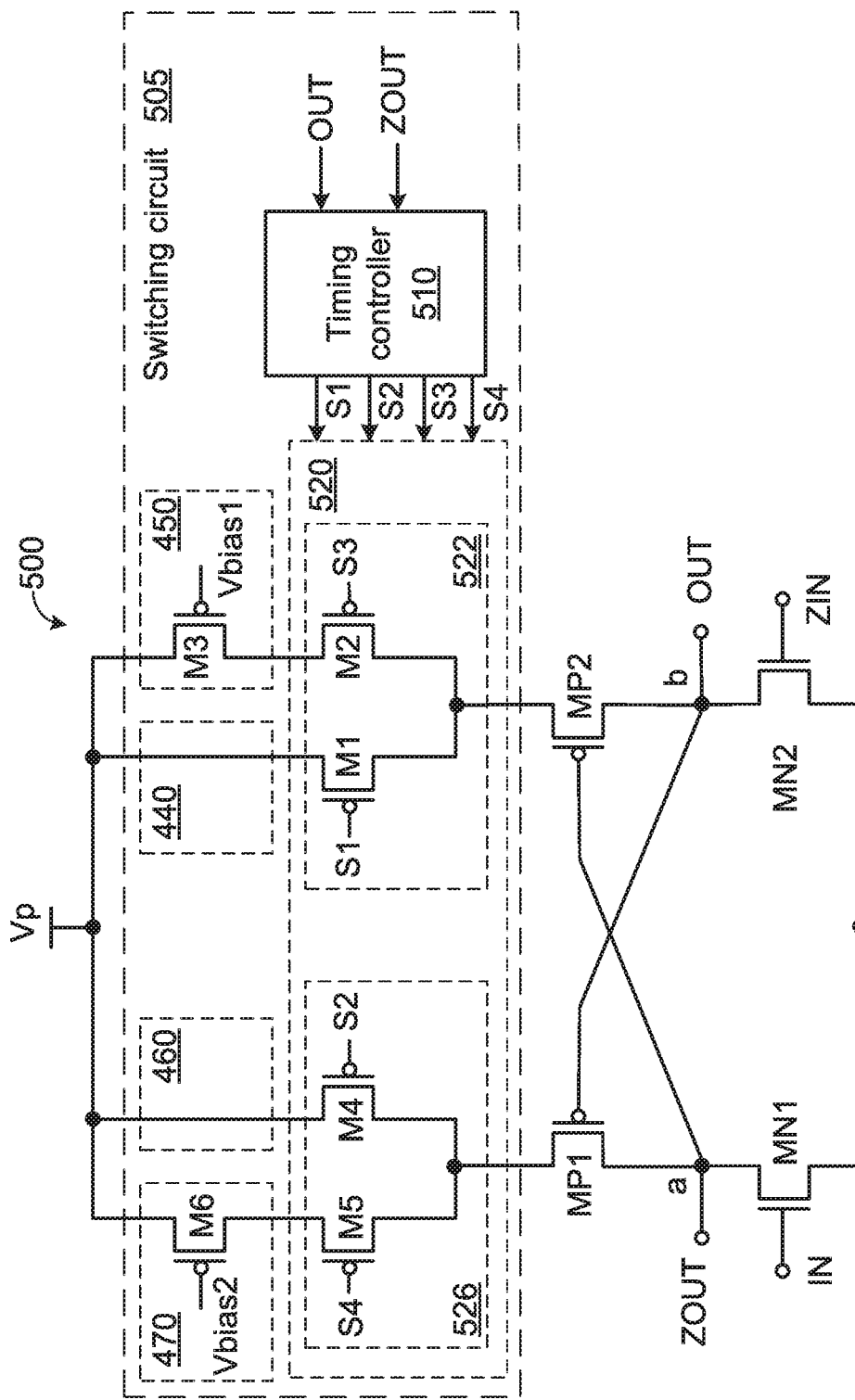
FIG. 5 is a schematic circuit diagram illustrating a level shifter according to a fourth embodiment of the present invention.

FIG. 5 is a schematic circuit diagram illustrating a level shifter according to a fourth embodiment of the present invention. In comparison with the third embodiment, the timing controller 510 and the selecting module 520 of the switching circuit 505 are distinguished. The inverters of the third embodiment are included in the timing controller of this embodiment. The operations of the other components are similar to those of the third embodiment, and are not redundantly described herein.

In the level shifter 500 of the fourth embodiment, the timing controller 510 receives the output signal OUT and the inverted output signal ZOUT and generates four selecting signals S1-S4 of the control signal group to the selecting module 520. The waveforms of the selecting signals S1-S4 are identical to those as shown in FIG. 4B. The timing controller 510 receives the output signal OUT. After the output signal OUT is delayed for one time period T by the timing controller 510, the selecting signal S1 is generated. The timing controller 510 receives the inverted output signal ZOUT. After the inverted output signal ZOUT is delayed for one time period T by the timing controller 510, the selecting signal S2 is generated. After the selecting signal S1 is inverted by the timing controller 510, the selecting signal S3 is generated. After the selecting signal S2 is inverted by the timing controller 510, the selecting signal S4 is generated. In an embodiment, the time period T is in the range between 5 ns and 15 ns.

It is noted that the timing controller 510 of the switching circuit 505 may be modified. For example, in another embodiment, the timing controller 510 receives the output signal OUT and generates the selecting signals S1 and S2 of the control signal group. In a further embodiment, the timing controller 510 receives the inverted output signal ZOUT and generates the selecting signals S1 and S2 of the control signal group.

In the above embodiments, the selecting circuits are operated according to the control signal group. For example, in the third embodiment, the level states of the selecting signals S1 and S3 are switched at the same time point. At any time, only one driving path is selected to be connected with its output terminal by the selecting circuit 422. Consequently, while the driving path is switched between the strong driving path and the weak driving path by the selecting circuit 422, the output signal OUT is possibly unstable. Similarly, the level states of the selecting signals S2 and S4 are switched at the same time point. Consequently, the inverted output signal ZOUT is possibly unstable.

Figure 6A:
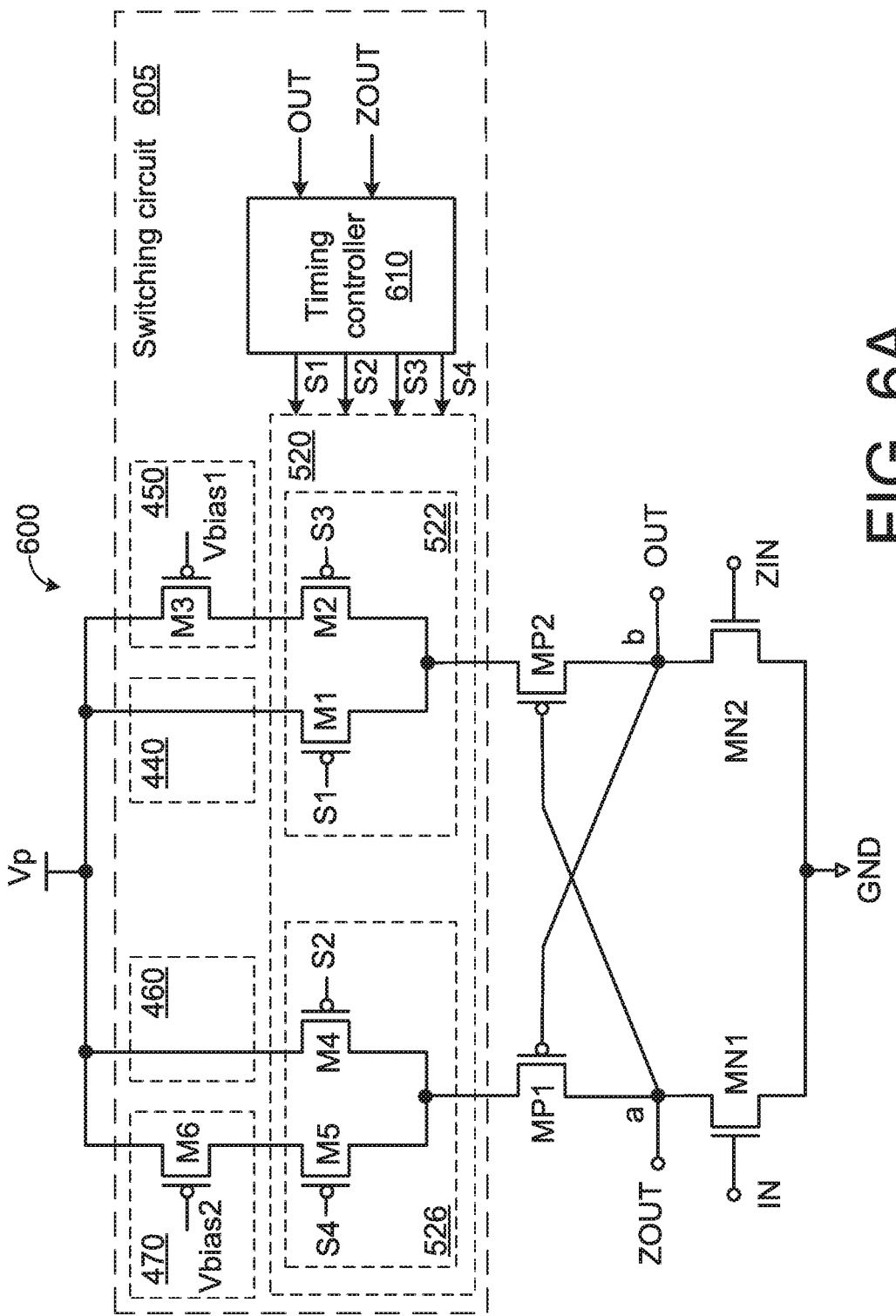
FIG. 6A is a schematic circuit diagram illustrating a level shifter according to a fifth embodiment of the present invention.
Figure 6B:
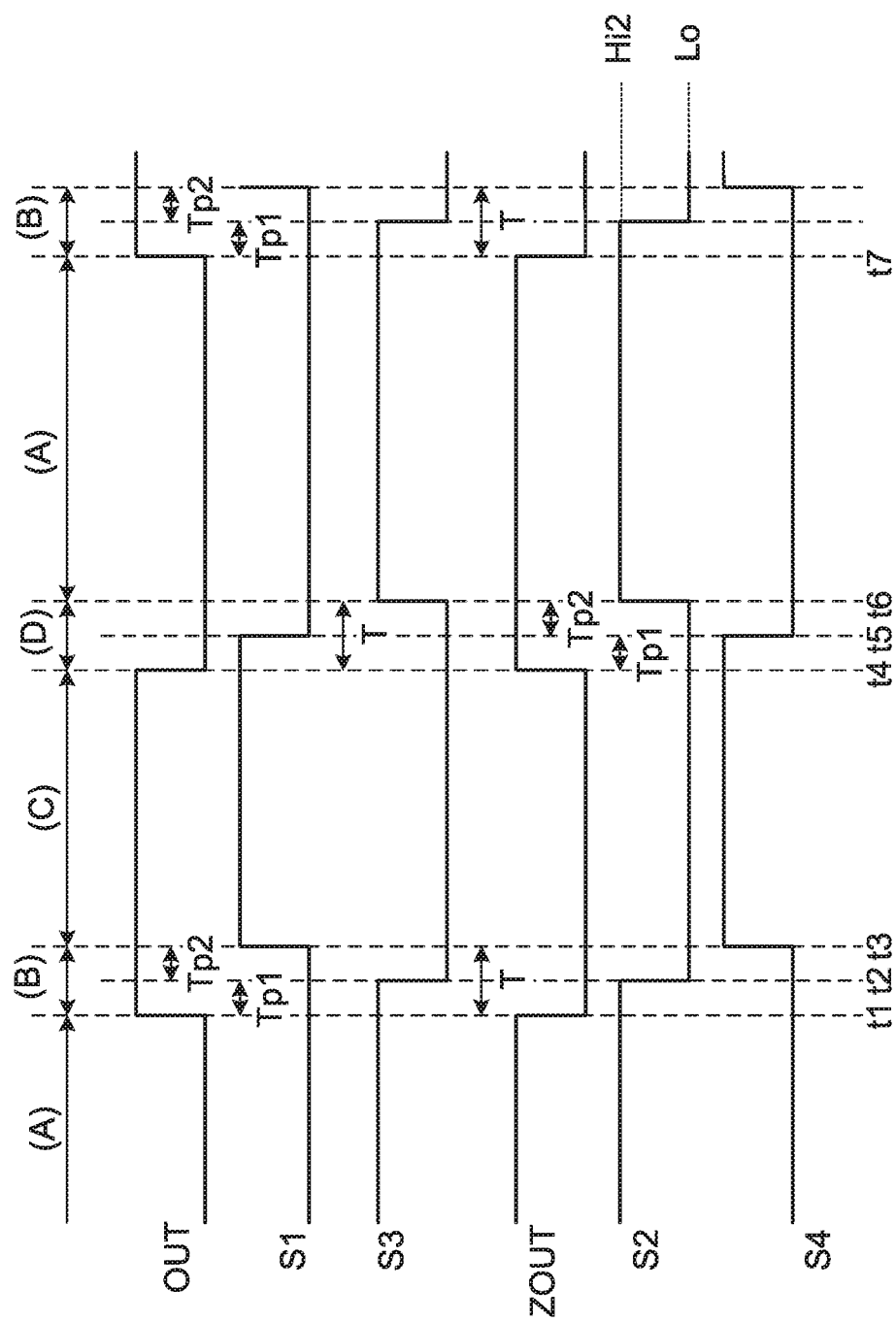
FIG. 6B is a schematic timing waveform diagram illustrating associated signals of the level shifter as shown in FIG. 6A.

Please refer to FIGS. 6A and 6B. FIG. 6A is a schematic circuit diagram illustrating a level shifter according to a fifth embodiment of the present invention. FIG. 6B is a schematic timing waveform diagram illustrating associated signals of the level shifter as shown in FIG. 6A. In comparison with the fourth embodiment, the waveforms of the control signal group from the timing controller of this embodiment are distinguished.

As shown in FIG. 6A, the level shifter 600 comprises a switching circuit 605, a P-type transistor MP1, a P-type transistor MP2, an N-type transistor MN1, and an N-type transistor MN2. The timing controller 610 of the switching circuit 605 is a delaying circuit. The timing controller 610 receives the output signal OUT and the inverted output signal ZOUT and generates a control signal group. The control signal group comprises four selecting signals S1, S2, S3 and S4.

In the operating states (B) and (D) of the level shifter 600, the selecting signals S1 and S3 are temporarily in the same level state (e.g., the low level state) and the selecting signals S2 and S4 are temporarily in the same level state (e.g., the low level state). The operating principles will be described in more details as follows.

Please refer to FIG. 6B. Before the time point t1, the level shifter 600 is in an operating state (A). Meanwhile, the output signal OUT is in the low level state Lo, and the inverted output signal ZOUT is in a second high level state Hi2. Since the selecting signal S1 is in the low level state Lo and the selecting signal S3 is in the second high level state Hi2, the P-type transistor M1 is turned on and the P-type transistor M2 is turned off. Meanwhile, the strong driving path 440 is connected with the source terminal of the P-type transistor MP2. Since the selecting signal S2 is in the second high level state Hi2 and the selecting signal S4 is in the low level state Lo, the P-type transistor M4 is turned off and the P-type transistor M5 is turned on. Meanwhile, the weak driving path 470 is connected with the source terminal of the P-type transistor MP1.

In this embodiment, the time period T of the level shifter 600 in each of the operating states (B) and (D) is divided into a first time interval Tp1 and a second time interval Tp2.

At the time point t1, the output signal OUT is changed to the second high level state Hi2 and the inverted output signal ZOUT is changed to the low level state Lo. Consequently, the operating state of the level shifter 600 is changed from the operating state (A) to the operating state (B). Since the selecting signal S1 is in the low level state Lo and the selecting signal S3 is in the second high level state Hi2, the P-type transistor M1 is turned on and the P-type transistor M2 is turned off. Meanwhile, the strong driving path 440 is connected with the source terminal of the P-type transistor MP2. Since the selecting signal S2 is in the second high level state Hi2 and the selecting signal S4 is in the low level state Lo, the P-type transistor M4 is turned off and the P-type transistor M5 is turned on. Meanwhile, the weak driving path 470 is connected with the source terminal of the P-type transistor MP1.

After the operating state of the level shifter 600 is changed to the operating state (B) for one first time interval Tp1 (i.e., at the time point t2), the selecting signal S1 is in the low level state Lo and the selecting signal S3 is changed to the low level state Lo. The P-type transistor M1 is turned on, and the P-type transistor M2 is turned on. Meanwhile, both of the strong driving path 440 and the weak driving path 450 are connected with the source terminal of the P-type transistor MP2. Moreover, since the selecting signal S2 is changed to the low level state Lo and the selecting signal S4 is in the low level state Lo, the P-type transistor M4 is turned on and the P-type transistor M5 is turned on. Meanwhile, both of the strong driving path 460 and the weak driving path 470 are connected with the source terminal of the P-type transistor MP1. Moreover, the output signal OUT is maintained in the second high level state Hi2, and the inverted output signal ZOUT is maintained in the low level state Lo.

After the operating state of the level shifter 600 is changed to the operating state (B) for one first time interval Tp1 and one second time interval Tp2 (i.e., at the time point t3), the selecting signal S1 is changed to the second high level state Hi2 and the selecting signal S3 is in the low level state Lo. The P-type transistor M1 is turned off, and the P-type transistor M2 is turned on. Meanwhile, the weak driving path 450 is connected with the source terminal of the P-type transistor MP2. Moreover, since the selecting signal S2 is in the low level state Lo and the selecting signal S4 is changed to the second high level state Hi2, the P-type transistor M4 is turned on and the P-type transistor M5 is turned off. Meanwhile, the strong driving path 460 is connected with the source terminal of the P-type transistor MP1. Moreover, the output signal OUT is maintained in the second high level state Hi2, and the inverted output signal ZOUT is maintained in the low level state Lo. Consequently, the operating state of the level shifter 600 is changed from the operating state (B) to the operating state (C).

At the time point t4, the output signal OUT is changed to the low level state Lo, and the inverted output signal ZOUT is changed to the second high level state Hi2. Consequently, the operating state of the level shifter 300 is changed from the operating state (C) to the operating state (D). Since the selecting signal S1 is in the second high level state Hi2 and the selecting signal S3 is in the low level state Lo, the P-type transistor M1 is turned off and the P-type transistor M2 is turned on. Meanwhile, the weak driving path 450 is connected with the source terminal of the P-type transistor MP2. Moreover, since the selecting signal S2 is in the low level state Lo and the selecting signal S4 is in the second high level state Hi2, the P-type transistor M4 is turned on and the P-type transistor M5 is turned off. Meanwhile, the strong driving path 460 is connected with the source terminal of the P-type transistor MP1.

After the operating state of the level shifter 600 is changed to the operating state (D) for one first time interval Tp1 (i.e., at the time point t5), the selecting signal S1 is changed to the low level state Lo and the selecting signal S4 is in the low level state Lo. The P-type transistor M1 is turned on, and the P-type transistor M2 is turned on. Meanwhile, both of the strong driving path 440 and the weak driving path 450 are connected with the source terminal of the P-type transistor MP2. Moreover, since the selecting signal S2 is in the low level state Lo and the selecting signal S4 is changed to the low level state Lo, the P-type transistor M4 is turned on and the P-type transistor M5 is turned on. Meanwhile, both of the strong driving path 460 and the weak driving path 470 are connected with the source terminal of the P-type transistor MP1. Moreover, the output signal OUT is maintained in the low level state Lo, and the inverted output signal ZOUT is maintained in the second high level state Hi2.

After the operating state of the level shifter 600 is changed to the operating state (D) for one first time interval Tp1 and one second time interval Tp2 (i.e., at the time point t6), the selecting signal S1 is in the low level state Lo and the selecting signal S3 is changed to the second high level state Hi2. The P-type transistor M1 is turned on, and the P-type transistor M2 is turned off. Meanwhile, the strong driving path 440 is connected with the source terminal of the P-type transistor MP2. Moreover, since the selecting signal S2 is changed to the second high level state Hi2 and the selecting signal S4 is in the low level state Lo, the P-type transistor M4 is turned off and the P-type transistor M5 is turned on. Meanwhile, the weak driving path 470 is connected with the source terminal of the P-type transistor MP1. Moreover, the output signal OUT is maintained in the low level state Lo, and the inverted output signal ZOUT is maintained in the second high level state Hi2. Consequently, the operating state of the level shifter 600 is changed from the operating state (D) to the operating state (A).

At the time point t7, the operating state of the level shifter 600 is changed from the operating state (A) to the operating state (B). The rest may be deduced by analogy.

From the above descriptions, the present invention provides a level shifter with asymmetrical driving paths. After the output signal in the high level state is outputted from a first output terminal of the level shifter and an inverted output signal in the low level state is outputted from a second output terminal of the level shifter, the first output terminal and the power supply voltage are connected with each other through a weak driving path and the second output terminal and the power supply voltage are connected with each other through a strong driving path. Whereas, after the output signal in the low level state is outputted from the first output terminal of the level shifter and the inverted output signal in the high level state is outputted from the second output terminal of the level shifter, the first output terminal and the power supply voltage are connected with each other through a strong driving path and the second output terminal and the power supply voltage are connected with each other through a weak driving path.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A level shifter, comprising:
   a first strong driving path;
   a first weak driving path;
   a second strong driving path;
   a second weak driving path;
   a selecting module comprising a first selecting circuit and a second selecting circuit, wherein the first strong driving path is connected between a power supply voltage and a first input terminal of the first selecting circuit, the first weak driving path is connected between the power supply voltage and a second input terminal of the first selecting circuit, the second strong driving path is connected between the power supply voltage and a first input terminal of the second selecting circuit, and the second weak driving path is connected between the power supply voltage and a second input terminal of the second selecting circuit;
   a first P-type transistor, wherein a source terminal of the first P-type transistor is connected with an output terminal of the second selecting circuit, a drain terminal of the first P-type transistor is connected with a first node, and a gate terminal of the first P-type transistor is connected with a second node;
   a second P-type transistor, wherein a source terminal of the second P-type transistor is connected with an output terminal of the first selecting circuit, a drain terminal of the second P-type transistor is connected with the second node, and a gate terminal of the second P-type transistor is connected with the first node, wherein the second node generates an output signal, and the first node generates an inverted output signal;
   a first N-type transistor, wherein a drain terminal of the first N-type transistor is connected with the first node, a source terminal of the first N-type transistor is connected with a ground terminal, and a gate terminal of the first N-type transistor receives an input signal;
   a second N-type transistor, wherein a drain terminal of the second N-type transistor is connected with the second node, a source terminal of the second N-type transistor is connected with the ground terminal, and a gate terminal of the second N-type transistor receives an inverted input signal, wherein when the input signal is in a first high level state, the output signal is in a second high level state, wherein when the input signal is in a low level state, the output signal is in the low level state; and
   a timing controller receiving one of the output signal and the inverted output signal or receiving both of the output signal and the inverted output signal, and then issuing a control signal group to the selecting module;
   wherein the control signal group includes a first selecting signal, a second selecting signal, a third selecting signal and a fourth selecting signal, the first selecting circuit is capable of connecting the first strong driving path to the source terminal of the second P-type transistor in response to the first selecting signal, the first selecting circuit is capable of connecting the first weak driving path to the source terminal of the second P-type transistor in response to the third selecting signal, the second selecting circuit is capable of connecting the second strong driving path to the source terminal of the first P-type transistor in response to the second selecting signal, and the second selecting circuit is capable of connecting the second weak driving path to the source terminal of the first P-type transistor in response to the fourth selecting signal;
   wherein after the output signal and the inverted output signal are respectively changed to the second high level state and the low level state for a time period, the first weak driving path is connected with the source terminal of the second P-type transistor by the first selecting circuit, and the second strong driving path is connected with the source terminal of the first P-type transistor by the second selecting circuit,
   wherein after the output signal and the inverted output signal are respectively changed to the low level state and the second high level state for the time period, the first strong driving path is connected with the source terminal of the second P-type transistor by the first selecting circuit, and the second weak driving path is connected with the source terminal of the first P-type transistor by the second selecting circuit.

2. The level shifter as claimed in claim 1, wherein the first selecting circuit comprises a third P-type transistor and a fourth P-type transistor, and the second selecting circuit comprises a fifth P-type transistor and a sixth P-type transistor, wherein a source terminal of the third P-type transistor is the first input terminal of the first selecting circuit, a gate terminal of the third P-type transistor receives the first selecting signal, and a drain terminal of the third P-type transistor is the output terminal of the first selecting circuit, wherein a source terminal of the fifth P-type transistor is the first input terminal of the second selecting circuit, a gate terminal of the fifth P-type transistor receives the second selecting signal, and a drain terminal of the fifth P-type transistor is the output terminal of the second selecting circuit, wherein a source terminal of the fourth P-type transistor is the second input terminal of the first selecting circuit, a gate terminal of the fourth P-type transistor receives the third selecting signal, and a drain terminal of the fourth P-type transistor is connected with the drain terminal of the third P-type transistor, wherein a source terminal of the sixth P-type transistor is the second input terminal of the second selecting circuit, a gate terminal of the sixth P-type transistor receives the fourth selecting signal, and a drain terminal of the sixth P-type transistor is connected with the drain terminal of the fifth P-type transistor.

3. The level shifter as claimed in claim 2, wherein the first strong driving path is a first conducting line between the power supply voltage and the first terminal of the first selecting circuit, the second strong driving path is a second conducting line between the power supply voltage and the first terminal of the second selecting circuit, the first weak driving path comprises a seventh P-type transistor, and the second weak driving path comprises an eighth P-type transistor, wherein a source terminal of the seventh P-type transistor is connected with the power supply voltage, a drain terminal of the seventh P-type transistor is connected with the second terminal of the first selecting circuit, a gate terminal of the seventh P-type transistor receives a first bias voltage, a source terminal of the eighth P-type transistor is connected with the power supply voltage, a drain terminal of the eighth P-type transistor is connected with the second terminal of the second selecting circuit, and a gate terminal of the eighth P-type transistor receives a second bias voltage.

4. The level shifter as claimed in claim 3, wherein each of the first bias voltage and the second bias voltage is a ground voltage.

5. The level shifter as claimed in claim 3, wherein the input voltage is used as the first bias voltage, and the inverted input signal is used as the second bias voltage.

6. The level shifter as claimed in claim 2, wherein the first selecting signal lags the output signal by the time period, the second selecting signal lags the inverted output signal by the time period, the third selecting signal is identical to the second selecting signal, and the fourth selecting signal is identical to the first selecting signal.

7. The level shifter as claimed in claim 2, wherein the time period is divided into a first time interval and a second time interval, wherein after the output signal and the inverted output signal are respectively changed to the second high level state and the low level state for the first time interval, the first weak driving path and the first strong driving path are connected with the source terminal of the second P-type transistor by the first selecting circuit, and the second weak driving path and the second strong driving path are connected with the source terminal of the first P-type transistor by the second selecting circuit, wherein after the output signal and the inverted output signal are respectively changed to the second high level state and the low level state for the first time interval and the second time interval, the first weak driving path is connected with the source terminal of the second P-type transistor by the first selecting circuit, and the second strong driving path is connected with the source terminal of the first P-type transistor by the second selecting circuit.

8. The level shifter as claimed in claim 7, wherein after the output signal and the inverted output signal are respectively changed to the low level state and the second high level state for the first time interval, the first strong driving path and the first weak driving path are connected with the source terminal of the second P-type transistor by the first selecting circuit, and the second strong driving path and the second weak driving path are connected with the source terminal of the first P-type transistor by the second selecting circuit, wherein after the output signal and the inverted output signal are respectively changed to the low level state and the second high level state for the first time interval and the second time interval, the first strong driving path is connected with the source terminal of the second P-type transistor by the first selecting circuit, and the second weak driving path is connected with the source terminal of the first P-type transistor by the second selecting circuit.

* * * * *